United States Patent
Park

(10) Patent No.: US 6,391,724 B1
(45) Date of Patent: May 21, 2002

(54) METHOD FOR MANUFACTURING A GATE STRUCTURE INCORPORATING ALUMINUM OXIDE AS A GATE DIELECTRIC

(75) Inventor: Dae-Gyu Park, Ichon-shi (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/722,481

(22) Filed: Nov. 28, 2000

(51) Int. Cl.⁷ .................... H01L 21/336; H01L 21/8238
(52) U.S. Cl. ................... 438/279; 438/216; 438/947
(58) Field of Search ............................. 438/216, 257, 438/275, 284, 279, 763, 765, 947

(56) References Cited

U.S. PATENT DOCUMENTS

| | | | | |
|---|---|---|---|---|
| 4,101,344 A | * | 7/1978 | Kooi et al. ............... | 148/1.5 |
| 4,145,233 A | * | 3/1979 | Sefick et al. ............. | 148/1.5 |
| 4,350,563 A | * | 9/1982 | Takada et al. ............ | 156/643 |
| 4,566,173 A | * | 1/1986 | Gossler et al. ........... | 29/571 |
| 5,399,387 A | * | 3/1995 | Law et al. ................. | 427/574 |
| 5,923,981 A | * | 7/1999 | Qian ......................... | 438/284 |
| 6,022,815 A | * | 2/2000 | Doyle et al. .............. | 438/947 |
| 6,100,204 A | * | 8/2000 | Gardner et al. ........... | 438/765 |
| 6,124,158 A | * | 9/2000 | Dautartas et al. ......... | 438/216 |
| 6,171,910 B1 | * | 1/2001 | Hobbs et al. .............. | 438/275 |
| 6,184,155 B1 | * | 2/2001 | Yu et al. ................... | 438/763 |
| 6,228,779 B1 | * | 5/2001 | Bloom et al. ............. | 438/763 |
| 6,245,606 B1 | * | 6/2001 | Wilk et al. ................ | 438/216 |
| 6,251,729 B1 | * | 6/2001 | Montree et al. .......... | 438/257 |

* cited by examiner

*Primary Examiner*—John F. Niebling
*Assistant Examiner*—Walter L. Lindsay, Jr.
(74) *Attorney, Agent, or Firm*—Finnegan, Henderson, Farabow, Garrett & Dunner, L.L.P.

(57) ABSTRACT

A method for forming a gate structure begins by preparing a semiconductor substrate provided with an isolation region formed therein. An ultra thin SiO2 layer is thermally grown on top of the semiconductor device by using a wet $H_2/O_2$ or a dry $O_2$ at a temperature ranging from approximately 650° C. to approximately 900° C. And then, an Al layer is deposited on top of the semiconductor substrate and annealed in the presence of oxygen gas or nitrous oxygen to convert the Al layer into an $Al_2O_3$ layer. Thereafter, a conductive layer is formed on top of the $Al_2O_3$ layer. Finally, the conductive layer is patterned into the gate structure.

16 Claims, 2 Drawing Sheets

METHOD FOR MANUFACTURING A GATE STRUCTURE INCORPORATING ALUMINUM OXIDE AS A GATE DIELECTRIC

CROSS-REFERENCE TO RELATED APPLICATION

Priority is claimed from Republic of Korean Patent Application No. 99-61792 filed Dec. 24, 1999, which is incorporated in its entirety by reference.

FIELD OF THE INVENTION

The present invention relates to a semiconductor device; and, more particularly, to a method for manufacturing a gate structure incorporated therein aluminum oxide as a gate dielectric.

DESCRIPTION OF THE PRIOR ART

As is well known, a semiconductor device has been downsized by a scale down of a design rule. Therefore, a gate oxide tends to rapidly approach 30 Å in thickness and below to increase the capacitance between a gate electrode and a channel region. However, the use of silicon dioxide as a gate dielectric is limited at this thickness and below. Once silicon dioxide is formed to a thickness of less than 30 Å, direct tunneling may occur through the gate dielectric to the channel region, thereby increasing a leakage current associated with the gate electrode and the channel region, causing an increase in power consumption.

Since reducing the thickness of the gate dielectric inherently increases the gate-to-channel leakage current, alternative methods have been developed to reduce this leakage current while maintaining thin $SiO_2$ equivalent thickness. One of these methods is to use a high K dielectric material such as $Ta_2O_5$ as the gate dielectric materials to increase the capacitance between the gate and the channel.

However, if a poly-silicon is utilized as a gate electrode, the use of $Ta_2O_5$ for gate dielectric materials has a disadvantage in integrating the semiconductor device. That is, an undesired $SiO_2$ is formed at an interface between $Ta_2O_5$ and the poly-silicon, which, in turn, increases an equivalent oxide thickness. In order to overcome this problem, a barrier metal such as TiN is employed. However, the TiN makes a threshold voltage shift changed.

Therefore, there is still a demand for developing a high K dielectric as a gate oxide with excellent leakage current as well as a low interface state with both a gate electrode and a silicon substrate.

SUMMARY OF THE INVENTION

It is, therefore, an object of the present invention to provide a method for manufacturing a gate structure incorporated therein aluminum oxide as a gate oxide for use in a semiconductor device.

In accordance with one aspect of the present invention, there is provided a method for manufacturing a gate structure for use in a semiconductor device, the method comprising the steps of: a) preparing a semiconductor substrate provided with an isolation region formed therein; b) forming an ultra thin $SiO_2$ layer on top of the semiconductor substrate; c) depositing an Al layer on top of the ultra thin $SiO_2$ layer; d) oxidizing the Al layer, thereby forming an $Al_2O_3$ layer; e) forming a conductive layer on top of the $Al_2O_3$ layer; and f) patterning the conductive layer, thereby obtaining the gate structure.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

There are provided in FIGS. 1 to 4 cross sectional views setting forth a method for manufacturing a gate structure 100 for use in a semiconductor device in accordance with preferred embodiments of the present invention.

Figure 1:
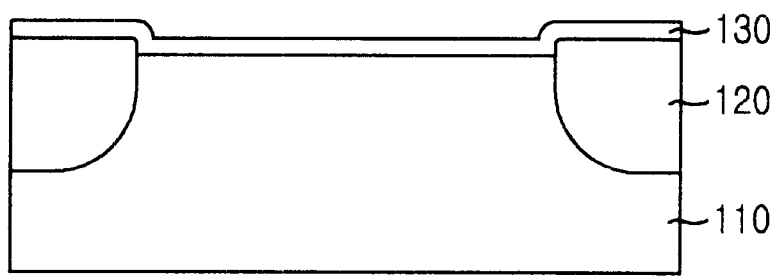
FIGS. 1 to 4 are schematic cross sectional views setting forth a method for the manufacture of a gate structure incorporated therein aluminum oxide as a gate oxide in accordance with the present invention.

Referring to FIG. 1, the process for manufacturing the gate structure 100 begins with the preparation of a semiconductor substrate 110 including an isolation region 120 for defining an active region. The isolation region 120 may be formed in a structure of local oxidation of silicon (LOCOS) or in a structure of shallow trench isolation (STI).

And then, an ultra thin silicon dioxide ($SiO_2$) layer 130 is thermally grown on the semiconductor substrate 110 by using a wet $H_2/O_2$ or a dry $O_2$ at a temperature ranging from approximately 650° C. to approximately 900° C. It is preferable that the ultra thin silicon $SiO_2$ layer 130 has a thickness ranging from approximately 3 Å to approximately 20 Å. Alternatively, it is possible that the ultra thin silicon $SiO_2$ layer 130 can be formed by using a rapid thermal process (RTP) at a temperature ranging from approximately 700° C. to approximately 900° C. in the presence of an oxygen gas or a $N_2O$ gas. It is preferable that the RTP is carried out in a pressure ranging from approximately 0.1 torr to approximately 1.0 torr.

Figure 2:
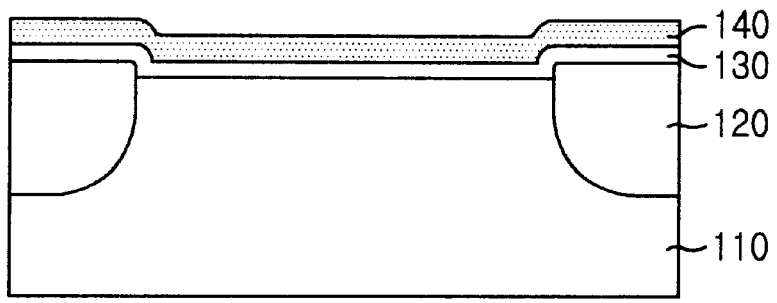

Referring to FIG. 2, an Al layer 140 is deposited on top of the ultra thin $SiO_2$ layer 130 at a temperature ranging from approximately 150° C. to approximately 500° C. by utilizing di methyl Al hydride (DMAH) as a source gas. It is preferable that the deposition process is carried out at a pressure ranging from approximately 0.2 torr to approximately 10 torr.

If a source is selected from a group consisting of tri methyl aluminum (TMA), $Al(CH_3)_2Cl$, $AlCl_3$ or the like as a source gas, the deposition process is carried out at a temperature ranging from approximately 200° C. to approximately 600° C. It is preferable that the deposition process is carried out at a pressure ranging from approximately 0.1 torr to approximately 10 torr and the Al layer has a thickness ranging from approximately 10 Å to approximately 80 Å.

Figure 3:
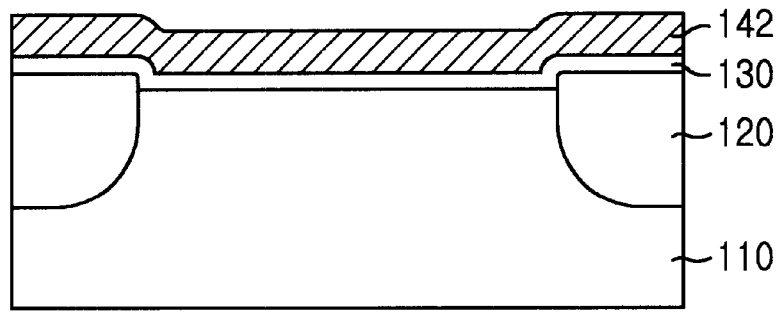

Referring to FIG. 3, the Al layer 140 is oxidized into an aluminum oxide ($Al_2O_3$) layer 142 by using a furnace annealing at a temperature ranging from approximately 450° C. to approximately 600° C. in a presence of an oxygen gas or a nitrous oxygen ($N_2O$) gas. The $Al_2O_3$ layer 142 also can be formed by RTP annealing the Al layer 140 at a temperature ranging from approximately 450° C. C to approximately 600° C. in presence of an oxygen gas or a $N_2O$ gas. And also, the $Al_2O_3$ layer 142 can be obtained by using a UV ozone ($O_3$) at a temperature ranging from approximately 300° to approximately 550° C.

In an ensuing step, a conductive material such as a poly-silicon is formed on top of the $Al_2O_3$ layer 142. The conductive material can be selected from a group consisting of a doped poly-Si, amorphous-Si, W-polycide, Ti-polycide, Co-polycide, Mo-polycide, W, Ta, WN, TiN or the like.

Figure 4:
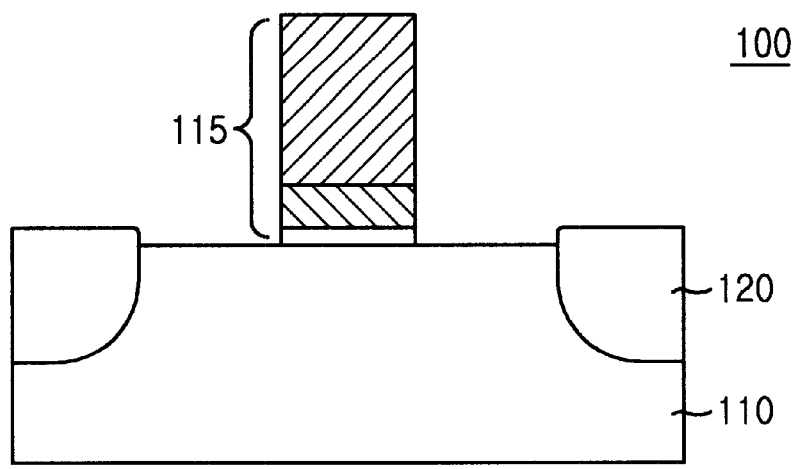

In a following step, the conductive material, the $Al_2O_3$ layer 142 and the ultra thin $SiO_2$ layer 130 are patterned into a predetermined configuration, thereby obtaining a gate structure 115 as shown in FIG. 4.

While the present invention has been described with respect to the particular embodiments, it will be apparent to those skilled in the art that various changes and modifications may be made without departing from the scope of the invention as defined in the following claims.

What is claimed is:

1. A method for manufacturing a gate structure for use in a semiconductor device, the method comprising:

a) preparing a semiconductor substrate provided with an isolation region formed therein b) forming a first gate dielectric layer with an ultra thin silicon dioxide ($SiO_2$) layer on top of the semiconductor substrate;

c) depositing an Al layer directly on top of the first gate dielectric layer;

d) oxidizing the Al layer, thereby forming a second gate dielectric layer with an aluminum oxide ($Al_2O_3$) layer;

e) forming a conductive layer on top of the second gate dielectric layer; and f) patterning the conductive layer, thereby obtaining the gate structure.

2. The method of claim 1, wherein the ultra thin $SiO_2$ layer is thermally grown at a temperature ranging from approximately 650° C. to approximately 900° C.

3. The method of claim 1, wherein forming the ultra thin silicon dioxide comprises using a rapid thermal process (RTP) at a temperature ranging from approximately 700° C. to approximately 900° C. in an oxygen gas atmosphere.

4. The method of claim 1, wherein forming the ultra thin silicon dioxide comprises using a rapid thermal process (RTP) at a temperature ranging from approximately 700° C. to approximately 900° C. in the presence of a nitrous oxygen.

5. The method of claim 1, wherein the isolation region is in the form of one of a local oxidation of silicon (LOCOS) and a shallow trench isolation (STI).

6. The method of claim 1, wherein depositing the Al layer comprises depositing at a temperature ranging from approximately 150° C. to approximately 500° C. and utilizing di methyl Al hydride (DMAH) as a source gas.

7. The method of claim 6, wherein depositing the Al layer further comprises depositing under a pressure ranging from approximately 0.2 torr to approximately 10 torr.

8. The method of claim 1, wherein depositing the Al layer comprises depositing at a temperature ranging from approximately 200° C. to approximately 600° C. and utilizing as a source gas a material selected from a group consisting of tri methyl aluminum (TMA), $Al(CH_3)_2Cl$, and $AlCl_3$.

9. The method of claim 8, wherein depositing the Al layer further comprises depositing at a pressure ranging from approximately 0.1 Torr to approximately 10 Torr.

10. The method of claim 1, wherein the Al layer has a thickness ranging from approximately 10 Å to approximately 80 Å.

11. The method of claim 1, wherein oxidizing the Al layer comprises using furnace annealing at a temperature ranging from approximately 450° C. to approximately 600° C. in an oxygen atmosphere.

12. The method of claim 1, wherein oxidizing the Al layer comprises using furnace annealing at a temperature ranging from approximately 450° C. to approximately 600° C. in the presence of nitrous oxygen ($N_2O$).

13. The method of claim 1, wherein oxidizing the Al layer comprises using a rapid thermal process (RTP) annealing at a temperature ranging from approximately 450° C. to approximately 600° C. in an oxygen atmosphere.

14. The method of claim 1, wherein oxidizing the Al layer comprises using RTP annealing at a temperature ranging from approximately 450° C. to approximately 600° C. in the presence of $N_2O$.

15. The method of claim 1, wherein oxidizing the Al layer comprises using UV ozone ($O_3$) at a temperature ranging from approximately 300° C. to approximately 550° C.

16. The method of claim 1, wherein the gate electrode comprises a conductive material selected from a group consisting of a doped poly-Si, amorphous-Si, W-polycide, Ti-polycide, Co-polycide, W, Ta, WN, TaN, and TiN.

* * * * *

UNITED STATES PATENT AND TRADEMARK OFFICE
CERTIFICATE OF CORRECTION

PATENT NO.   : 6,391,724 B1
DATED        : May 21, 2002
INVENTOR(S)  : Dae-Gyu Park It is certified that error appears in the above-identified patent and that said Letters Patent is hereby corrected as shown below:

<u>Title page,</u>
After Item [22] and before Item [51], insert the following missing information:
-- [30]   Foreign Application Priority Data
December 24, 1999 (KR)........................ 1999-61792 --.

<u>Column 3,</u>
Line 12, "therein" should read -- therein; --.

<u>Column 4,</u>
Line 10, "A1CI$_3$" should read -- A1C1$_3$ --.

Signed and Sealed this

Twelfth Day of November, 2002

Attest:

JAMES E. ROGAN
Attesting Officer    Director of the United States Patent and Trademark Office